(12) United States Patent
Nakamura et al.

(10) Patent No.: US 6,739,040 B1
(45) Date of Patent: May 25, 2004

(54) METHOD OF MANUFACTURING MULTILAYERED PRINTED WIRING BOARD USING ADHESIVE FILM

(75) Inventors: Shigeo Nakamura, Kawasaki (JP); Tadahiko Yokota, Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 0 days.

(21) Appl. No.: 09/696,179

(22) Filed: Oct. 26, 2000

(30) Foreign Application Priority Data

Oct. 28, 1999 (JP) ............................................ 11-307091
Jul. 6, 2000 (JP) ........................................ 2000-205132

(51) Int. Cl.[7] .............................. H05K 6/36; H05K 3/10; H05K 1/03
(52) U.S. Cl. ............................. 29/830; 29/831; 29/846; 29/847; 174/255
(58) Field of Search ........................... 29/830, 831, 846, 29/847, 852; 174/255, 256, 258, 259, 260, 262; 361/771, 792–795; 428/209, 901; 523/427, 428, 429

(56) References Cited

U.S. PATENT DOCUMENTS

| | | | |
|---|---|---|---|
| 3,956,041 A | 5/1976 | Polichette et al. | |
| 5,057,372 A | * 10/1991 | Imfeld et al. | ................ 428/412 |
| 5,344,893 A | 9/1994 | Asai et al. | |
| 5,346,750 A | 9/1994 | Hatakeyama et al. | |
| 6,376,053 B1 | 4/2002 | Nakamura et al. | |

FOREIGN PATENT DOCUMENTS

| | | | |
|---|---|---|---|
| EP | 0 351 034 A2 | 1/1990 | |
| EP | 0 377 332 A2 | 7/1990 | |
| EP | 0 394 678 A2 | 10/1990 | |
| EP | 0 851 726 A2 | 7/1998 | |
| JP | 10-027960 | * 1/1998 | ............ H05K/3/46 |
| JP | 10-284840 | * 10/1998 | ............ H05K/3/46 |
| JP | 11-87927 | 3/1999 | |
| JP | 11-069995 | 3/1999 | |
| JP | 11-340625 | * 12/1999 | ............ H05K/3/46 |

* cited by examiner

Primary Examiner—Carl J. Arbes
Assistant Examiner—Theim D Phan
(74) Attorney, Agent, or Firm—Oblon, Spivak, McClelland, Maier & Neustadt, P.C.

(57) ABSTRACT

The present invention relates to a method of manufacturing a multilayered printed wiring board by a buildup system in which a conductive circuit layer and an insulating layer are alternately piled up. This method also involves using an adhesive film to facilitate manufacturing the multilayered printed wiring board having excellent surface smoothness at satisfactory yields.

21 Claims, 3 Drawing Sheets

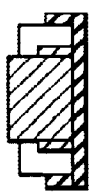 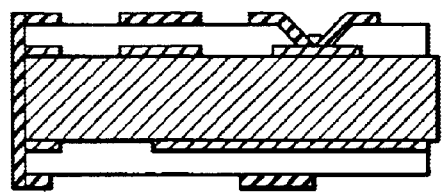
*FIG. 1A-1*  *FIG. 1A-2*
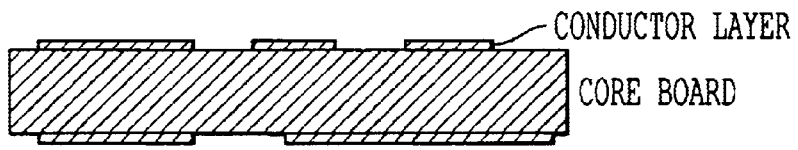
*FIG. 2A*
*PRIOR ART*
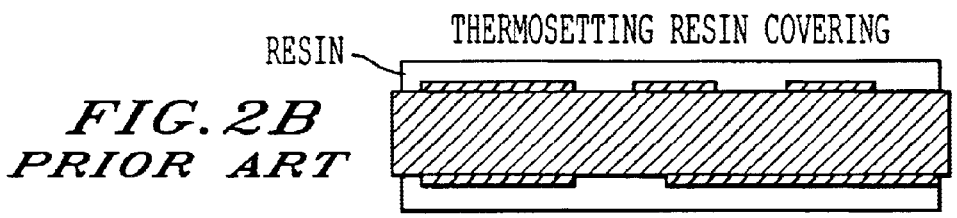
*FIG. 2B*
*PRIOR ART*
THERMAL CURING FOLLOWED BY LASER/DRILL PERFORATING
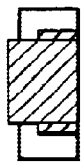 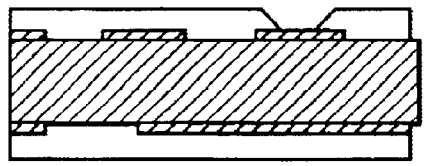
*FIG. 2C-1*  *FIG. 2C-2*
*PRIOR ART*  *PRIOR ART*
ROUGHENING, FOLLOWED BY COPPER PLATING
 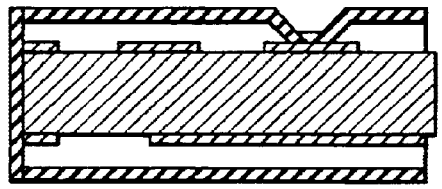
*FIG. 2D-1*  *FIG. 2D-2*
*PRIOR ART*  *PRIOR ART*

HOLE-FILLING INK OR CONDUCTIVE PASTE CHARGING

POLISHING

COPPER PLATING

PATTERN FORMATION

THERMALLY CURING, FOLLOWED BY LASER PERFORATING
 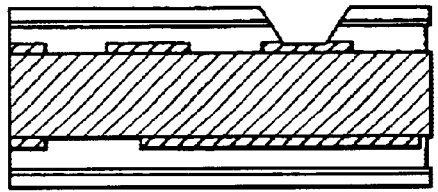
*FIG. 3C-1*    *FIG. 3C-2*
CONDUCTIVE PASTE CHARGING
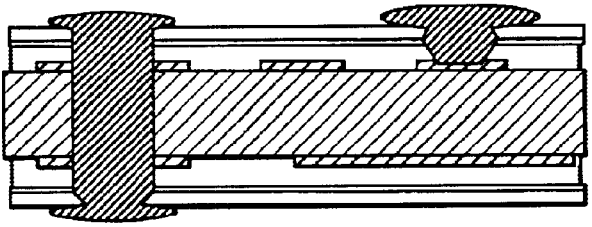
*FIG. 3D*
STRIPPING THE SUPPORT BASE FILM, FOLLOWED BY THERMALLY CURING, OR THE REVERSE
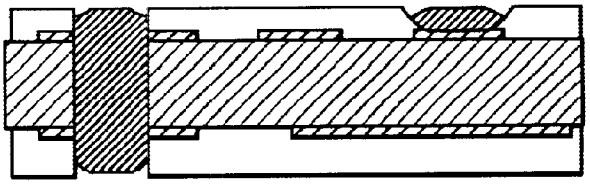
*FIG. 3E*
ROUGHENING FOLLOWED BY COPPER PLATING
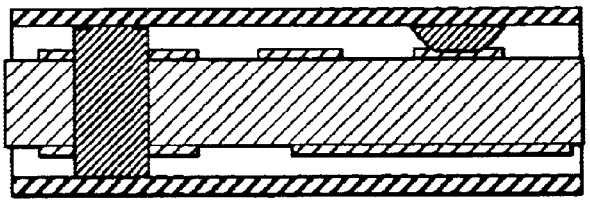
*FIG. 3F*
PATTERN FORMATION
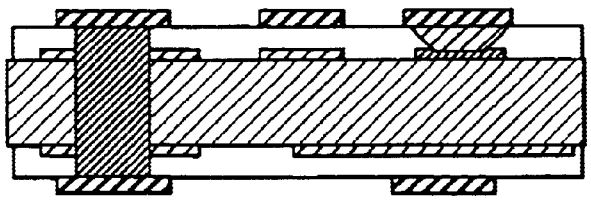
*FIG. 3G*

METHOD OF MANUFACTURING MULTILAYERED PRINTED WIRING BOARD USING ADHESIVE FILM

BACKGROUND OF THE INVENTION

1. Industrial Field

The present invention relates to a method of manufacturing a multilayered printed wiring board by a buildup system in which a conductive circuit layer and an insulating layer are alternately piled up, said method further comprising using an adhesive film to easily manufacture such multilayered printed wiring board excellent in surface smoothness in satisfactory yields.

2. Prior Art

In recent years, techniques of manufacturing a multilayered printed wiring board by a buildup method of alternately piling up an organic insulating layer on a conductor layer of an inner-layer circuit board are drawing attention. Above all, with the progress of a laser processing technique, a method of manufacturing a multilayered printed wiring board which method comprises covering an inner-layer circuit substrate with a copper foil provided with a thermosetting resin or directly with a thermosetting resin, followed by performing curing by heating, performing perforating with a laser and/or a drill, and forming the conductor layer by plating, has been broadly used. In Japanese Patent Application Laid-Open (Kokai) No. 87927/1999, the present inventors have also disclosed an adhesive film which uses a thermal fluid resin composition capable of filling a circuit through hole and which is excellent in the properties for covering an inner-layer circuit pattern, and a method of manufacturing a similar multilayered printed wiring board using the adhesive film. Japanese Patent Application Laid-Open (Kokai) No. 87927/1999 discloses a method of vacuum-laminating the thermosetting resin composition layer supported by a support base film on a circuit substrate substantially at 80° C.×5 seconds before thermally curing the thermosetting resin, but fails to refer to the subsequent step of thermally curing the resin composition.

If a resin composition layer is vacuum-laminated on a circuit substrate with the support base film not having been stripped, followed by stripping the support base film, and curing the resin composition, foreign matters stick during thermally curing of the resin, which may cause later on the problems of disconnection, short-circuit, and other defects. Moreover, concerning a built-up substrate made by these processes, as can be seen from FIG. 1, since a circuit or a via cannot be formed on the via and/or the through hole, the degree of freedom is limited in design, it is difficult to use an automatic arrangement wiring tool, and much time is disadvantageously required in circuit design.

As a method of solving such defects, techniques of filling the via and/or the through hole with a hole filling ink or a conductive paste are known. A surface smoothing process of a conventional built-up substrate will be described with reference to FIG. 2. First, a thermosetting resin is applied or laminated on an inner-layer circuit substrate pattern, followed by thermally curing. Subsequently, perforating is performed with a laser and/or a drill. Subsequently, the resin surface is subjected to a roughing treatment with an alkaline oxidizer or the like, and then a conductor layer is formed by plating. Even when a copper foil provided with a thermosetting resin is used, conductor connection is performed in the hole by plating to form a similar structure. Thereafter, the hole is filled with a hole filling ink or a conductive paste by screen printing, and the thermal curing is performed. Subsequently, by polishing the surface and forming the conductor layer once again by plating, it becomes possible to form a circuit on the via or the through hole.

According to the conventional method, as has been described above, it is necessary to manufacture a hole filling screen print with good precision for each pattern of the via and/or the through hole, additionally a step of polishing the surface to remove the hole filling ink or the conductive paste having stuck out in the vicinity of the printed surface is essential, and therefore, there is the problem that the overall process gets lengthened and complicated.

SUMMARY OF THE INVENTION

Problem to be Solved by the Invention

It is an object of the present invention to develop a method of preventing foreign matters particularly from being mixed in a thermally cured resin composition surface, and thereby manufacturing easily a multilayered printed wiring board superior in surface smoothness, upon curing thermally a resin composition layer of an adhesive film provided with a support base film on a circuit substrate in good yields.

Means for Solving the Problem

The present inventors have found that the problem can be solved by preventing the thermosetting resin composition from directly contacting the air outside until it is thermally cured, and have solved the defect that foreign matters stick to the resin during being cured.

Accordingly, according to the present invention, there is provided as a first embodiment thereof a method of manufacturing a multilayered printed wiring board using an adhesive film comprising a support base film provided with a mold release layer and a thermosetting resin composition laminated on the surface of the mold release layer, said resin composition being provided with the same or smaller area as or than that of the support base film, provided with thermal fluidity, and being solid at normal temperatures, said method further comprising essentially the steps of:

1) directly covering at least the pattern processed portion on one surface or both surfaces of a pattern processed circuit substrate with the resin composition layer of said adhesive film, and performing laminating by heating and pressurizing under a vacuum condition;
2) thermally curing the resin composition with the support base film being attached thereto;
3) uncovering the resin composition layer by stripping at least the support base film followed by performing perforating with a laser and/or a drill, or performing perforating with a laser and/or a drill followed by stripping at least the support base film;
4) subjecting the resin composition surface to a roughing treatment; and
5) subsequently plating the roughed surface, and forming a conductor layer.

As a second embodiment of the present invention wherein a conductive paste is utilized to perform interlayer connection, there is provided a method of manufacturing a multilayered printed wiring board using an adhesive film comprising a support base film provided with a mold release layer and a thermosetting resin composition laminated on the surface of the mold release layer, said resin composition being provided with the same or smaller area as or than that of the support base film, provided with thermal fluidity and being solid at normal temperatures, said method further comprising essentially the steps of:
1) directly covering at least the pattern processed portion on one surface or both surfaces of a pattern processed circuit substrate with the resin composition layer of said adhesive film, and performing laminating by heating and pressurizing under a vacuum condition;
2) thermally curing the resin composition followed by performing perforating with a laser and/or a drill;
3) charging the conductive paste into the resulting hole(s);
4) uncovering the resin composition layer by stripping at least the support base film followed by thermally curing the conductive paste, or thermally curing the conductive paste followed by stripping at least the support base film;
5) subjecting the resin composition surface to a roughing treatment; and
6) subsequently plating the roughed surface, and forming a conductor layer.

Finally, as a third embodiment of the present invention, there is provided a method of manufacturing a multilayered printed wiring board using an adhesive film comprising a support base film provided with a mold release layer and a thermosetting resin composition laminated on the surface of the mold release layer, said resin composition being provided with the same or smaller area as or than that of the support base film, provided with thermal fluidity and being solid at normal temperatures, said method further comprising essentially the steps of:
1) directly covering at least the pattern processed portion on one surface or both surfaces of a pattern processed circuit substrate with the resin composition layer of said adhesive film, and performing lamination by heating and pressurizing under a vacuum condition; and
2) thermally curing the resin composition with the support base film being attached thereto whereby an insulation layer is formed.

BRIEF DESCRIPTION OF THE DRAWINGS

FIGS. 1A-1 to 1A-2 shows a section of a conventional built-up substrate.

FIGS. 2A, 2B, 2C-1, 2C-2, 2D-1, 2D-2, 2E, 2F, 2G, and 2H show Steps (a) to (h) for conventional smoothing, vertically in that order.

FIGS. 3A, 3B, 3C-1, 3C-2, 3D, 3E, 3F, and 3G show Steps (a) to (g) for a method of manufacturing a multilayered printed wiring board of the present invention including smoothing by stripping the support base film and subsequent formation of a plating layer and circuit, vertically in that order.

DETAILED DESCRIPTION OF THE INVENTION

A thermosetting resin composition being solid at normal temperatures according to the present invention is not particularly limited as long as any resin composition comprises a thermosetting resin and/or a high polymer molecule as the main component, becomes softened by heating, has a film forming ability, and is thermally cured to satisfy the properties required of an interlayer insulating material, such as heat resistance and electric properties. For example, there may be mentioned an epoxy resin based material, an acrylic resin based material, a polyimide resin based material, a polyamide-imide resin based material, a polycyanate resin based material, a polyester resin based material, a thermosetting polyphenylene ether resin based material, and the like. Moreover, two or more of these materials can be combined for use. They can be formed into an adhesive film provided with a multilayered structure. Above all, among the epoxy resin based materials superior in reliability and cost as the interlayer insulating material, there can be mentioned an epoxy resin composition disclosed in Japanese Patent Application Laid-Open (Kokai) No. 87927/1999.

The adhesive film can be prepared by a known conventional method of applying a resin varnish dissolved in a predetermined organic solvent onto the mold release layer of a base film provided with a mold release layer as a support, and subsequently evaporating the solvent by heating and/or hot-air spraying, whereby a thermosetting resin composition being solid at normal temperatures is formed.

As such support base film, there may be exemplified polyethylene, polyvinyl chloride and other polyolefins; polyethylene terephthalate and other polyesters; polycarbonate; and further mold release paper, metal foils such as copper foil, and aluminum foil, and the like.

The support base film is generally in thickness within a range of 10 to 100 $\mu$m. As the mold release layer, a known conventional silicone based material, and a nonsilicone based material can be used in accordance with the properties of resin varnish, and the thickness thereof is generally 3 $\mu$m or less. The thickness of the thermosetting resin composition being solid at normal temperatures is not less than the conductor thickness of the inner-layer circuit substrate to be laminated, and is generally within a range of the conductive thickness plus (10 to 120) $\mu$m.

The adhesive film according to the present invention which film comprises a thermosetting resin composition being solid at normal temperatures and a support base film, is, when made, wound into a roll as it is, or after a mold release protective film has been further laminated on the other surface of the resin composition, and stored.

Figure 2E:
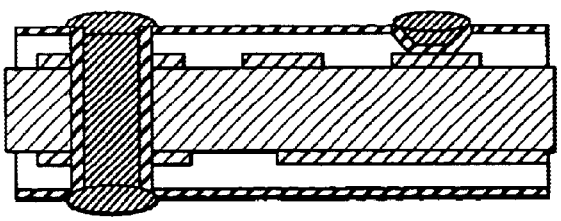
Figure 2F:
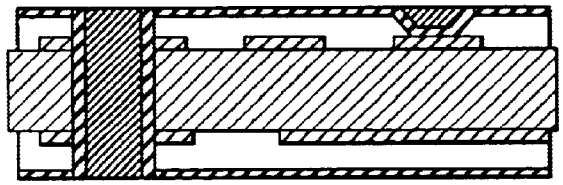
Figure 2G:
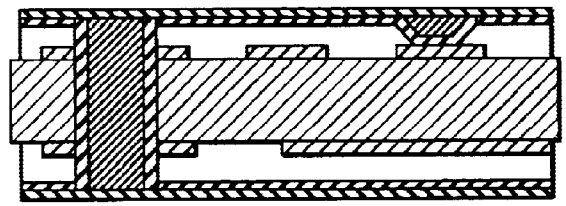
Figure 2H:
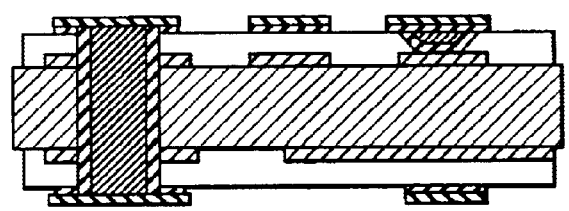
Figure 3A:
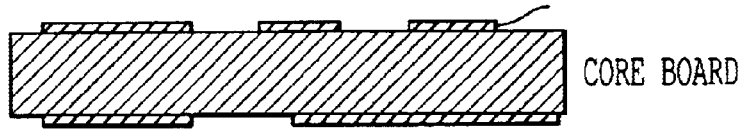
Figure 3B:
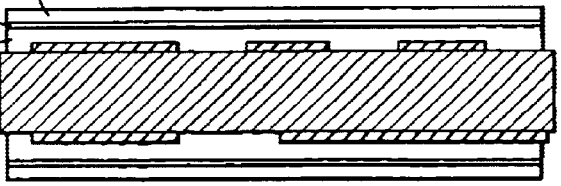

Steps of the present invention will be next described concretely with reference to FIG. 3.

First, in order to perform laminating by heating and pressurizing under a vacuum condition while at least the pattern processed portion on one surface or both surfaces of a pattern processed circuit substrate is directly covered with a resin composition layer of the adhesive film, a vacuum applicator manufactured by Nichigo Morton Kabushiki Kaisha, a vacuum pressurizing laminator manufactured by Kabushiki Kaisha Meiki Seisakusho, a vacuum rolling dry coater manufactured by Hitachi Techno-Engineering Kabushiki Kaisha and other commercially available vacuum laminators can be used. When the adhesive film is provided with a protective film, the adhesive film is, after the protective film has been removed, laminated on the pattern processed portion, on the resin composition layer side thereof by pressurizing and heating under a vacuum condition from the side of the support base film.

By performing laminating on condition that the thickness of the resin flow during laminating is not less than the conductor thickness of an inner-layer circuit, the inner-layer circuit pattern can be satisfactorily covered. Concretely, after preheating the film and inner-layer circuit substrate as occasion demands, laminating is preferably performed at a contact bonding temperature of 70 to 130° C., a contact bonding pressure of 1 to 11 kgf/cm$^2$, and under reduced pressure of 10 millibars or less.

The laminating can be performed either batch-wise or continuously with a roll.

Subsequently, the resin composition is thermally cured with the support base film being attached thereto. Therefore, dirt or foreign matters fail to stick to the resin surface during being cured, whereby the conventional problem of foreign matter sticking is solved, and expensive facilities such as a clean oven and the like become unnecessary.

Thereafter, with or without the support base film, perforating is performed with a laser and/or a drill.

The thermal curing condition differs with resins, but is selected from a range of 100 to 200° C. and 10 to 90 minutes. Step curing from a slightly low temperature to a high temperature is, above all, preferable in respect of finishing.

The thermal curing is indispensable for uniformity of a hole shape in the subsequent perforating step, and for resistance to the organic solvent or the like contained in a conductive paste when such paste is used.

For perforating, commercially available carbonic acid gas, UV-YAG, excimer or other laser drill and/or a drill perforator is used, and the perforating is performed at the predetermined position(s) by a known conventional method. After perforating, the inside of the hole may be cleaned by mechanical treatments such as jet scrubbing, or chemical treatments such as soft etching.

With respect to the adhesive film of the present invention, since the support base film is provided with a mold release layer, the film can easily be stripped after the thermosetting resin composition has been thermally cured.

According to the first and third embodiments of the present invention, the aforementioned steps are followed by the conventional process disclosed in Japanese Patent Application Laid-Open (Kokai) No. 87927/1999, or the same steps as those shown in FIG. 2, whereby a multilayered printed wiring board is completed.

On the other hand, according to the second embodiment of the present invention in which a conductive paste is used to perform interlayer connection, the above-described steps are followed by filling the hole(s) with the conductive paste. As the conductive paste, not only a commercially available metal powder paste such as a silver paste, a copper paste, or the like, but also a paste containing conductive particles, or the like, can be used. In order to fill the hole(s), considering from the properties of conductive pastes currently on the market, screen printing is generally carried out, but that is not limited thereto. When printing is necessary for both the surfaces of the inner-layer circuit substrate, a method of simultaneously printing both the surfaces, or a method of printing one surface and subsequently performing thermal curing, followed by printing the back surface, is selected. In the printing, since the support base film perforated simultaneously with the resin composition layer serves as a high-precision contact mask, there can be obtained the excellent characteristic that no conductive paste sticks to the surface of the resin composition other than the hole portion. This enables selective electric connection by a conductive paste which has been heretofore difficult. Moreover, to enhance such filling into a small-diameter via, it is also preferable to perform a pressure reducing treatment step after printing.

Subsequently performed is the step of stripping the support base film before thermally curing the conductive paste, or the step of thermally curing the conductive paste before stripping the support base film, both in order to uncover the resin composition layer. With respect to the adhesive film of the present invention, since the support base film is provided with the mold release layer, the film can be easily stripped after the thermosetting resin composition and/or the conductive paste has been thermally cured. The thermal curing conditions differ with the resins and conductive pastes, and are selected from a range of 100 to 200° C. and 10 to 90 minutes.

Thereafter, in the conventional process, a step of polish-removing the sticking-out portion in the vicinity of the hole surface, of the hole filling ink or the conductive paste, during filling the hole(s) therewith, is essential. According to the process of the present invention, however, since no conductive paste sticks to the resin composition surface other than the hole portion as has been described above, such polishing step can be omitted. When the support base film is stripped, the mold release layer is simultaneously stripped, but a part of the mold release layer remains on the resin composition surface in some cases. Even in this case, the sticking mold release layer can be removed in the next roughing step.

Thereafter, the resin composition surface is subjected to a roughening treatment, and then a conductor layer is formed on the top layer by plating. As the roughening treatment, there may be mentioned a chemical treatment with permanganate, bichromate, ozone, hydrogen peroxide/sulfuric acid, nitric acid or other oxidizer, as well as buffing, sand blasting and other mechanical polishing, plasma etching, or the like.

After forming a convex/concave anchor on the resin composition surface, electroless plating, electrolytic plating or other plating is performed to form a conductor layer. Thereafter, by following a known conventional subtractive process or a semi-additive process, a circuit can be formed without placing any restriction on the via or the through hole. Moreover, by forming a plating resist of a pattern reverse to the pattern of the conductor layer subjected to the roughening treatment, a conductor circuit may be formed only by electroless plating.

The process which essentially requires the aforementioned steps obviates the necessity of a step necessary in the conventional method, of polishing the surface to remove the hole filling screen print for each pattern of the via and/or the through hole and the hole filling ink or the conductive paste sticking out in the vicinity of the printed surface, so that step reduction and cost reduction are possible.

EXAMPLES

The present invention will be concretely described hereinafter by way of example, but the present invention is not limited thereto.

Manufacture Example of Adhesive Film

In methyl ethyl ketone were dissolved by heating with stirring, 20 parts of liquefied bisphenol A epoxy resin ("Epycoat 828 EL" manufactured by Yuka Shell Epoxy Kabushiki Kaisha), 20 parts of brominated bisphenol A epoxy resin ("YDB-500" manufactured by Tohto Kasei Kabushiki Kaisha), 20 parts of cresol novolak epoxy resin ("Epychron N-673" manufactured by Dainippon Ink & Chemicals, Inc.) and 15 parts of terminal end epoxidated polybutadiene rubber ("Denarex R-45 EPT" manufactured by Nagase Kasei Kogyo Kabushiki Kaisha), followed by adding thereto 50 parts of brominated phenoxy resin varnish (a nonvolatile content of 40 wt %, "YPB-40-PXM40" manufactured by Tohto Kasei Kabushiki Kaisha), and 4 parts of 2,4-diamino-6-(2-methyl-1-imidazorylethyl)-1,3,5-triazine.isocyanuric acid adduct as the epoxy curing agent, as well as 2 parts of finely ground silica, 4 parts of antimony trioxide, and 5 parts of calcium carbonate, whereby a resin composition varnish was prepared.

The varnish was applied onto a polyethylene terephthalate film with a thickness of 25 $\mu$m and provided with a silicone mold release layer ("Cerapeel BK" manufactured by Toyo Metallizing Kabushiki Kaisha) with a die coater in such amount that the resulting resin layer had, after dried, a thickness of 70 μm, and drying was performed at 80 to 120° C., whereby an adhesive film was obtained.

Example 1

1) On each of both the patterned surfaces of a pattern processed 510×340 mm glass epoxy double surface circuit substrate (plate thickness of 0.4 mm, and conductor thickness of 35 μm), the adhesive film obtained in Manufacture Example of Adhesive Film was sheeted in a size of 507×336 mm on the resin side thereof. Subsequently, with the use of a "Vacuum Applicator 725" manufactured by Morton International Incorporated, both the surfaces were simultaneously subjected to laminating at a degree of vacuum of 1 millibar, and a temperature of 80° C. by 15-second pressing.

2) Thermal curing was performed at 100° C. for 30 minutes and further at 170° C. for 30 minutes.

3) After stripping the support base film, a commercially available carbonic acid gas laser and a drill perforator on the market were used to perform perforating in the predetermined position(s). Stripping was very lightly and easily performed, and defects such as foreign matter sticking and the like were not found on the resin surface.

4) The resin composition surface was subjected to the roughening treatment with an alkaline oxidizer of permanganate, and 5) electroless and electrolytic copper plating was performed, and the subtractive method was performed to obtain a four-layer printed wiring board.

Example 2

1) On each of both the patterned surfaces of a pattern processed 510×340 mm glass epoxy double surface circuit substrate (plate thickness of 0.4 mm, and conductor thickness of 35 μm), the adhesive film obtained in Manufacture Example of Adhesive Film was sheeted in a size of 507×336 mm on the resin side thereof. Subsequently, with the use of a "Vacuum Applicator 725" manufactured by Morton International Incorporated, both the surfaces were simultaneously subjected to laminating at a degree of vacuum of 1 millibar, and a temperature of 80° C. by 15-second pressing.

2) After performing thermal curing at 130° C. for 30 minutes, perforating was performed in the predetermined position(s) with a commercially available carbonic acid gas laser and a drill perforator on the market. The laser via diameter was 150 μm, and the through hole diameter was 200 μm. Thereafter, the inside of the hole(s) was cleaned by a jet scrub treatment.

3) The laser via and the through hole were filled with a silver paste on the market by screen printing. The printing was performed in such manner that one surface was first printed, followed by performing thermal curing at 130° C. for 10 minutes, and then the back surface was similarly printed and thermally cured.

4) After performing thermal curing at 170° C. for 30 minutes, the support base film was stripped. The stripping was very lightly and easily performed.

5) The resin composition surface was subjected to the roughening treatment with the use of an alkaline oxidizer of permanganate, and 6) the electroless and electrolytic copper plating was performed and the subtractive process was performed to obtain a four-layer printed wiring board.

Example 3

1) On each of both the patterned surfaces of a pattern processed 510×340 mm glass epoxy double surface circuit substrate (plate thickness of 0.8 mm, and conductor thickness of 35 μm), the adhesive film obtained in Manufacture Example of Adhesive Film was sheeted in a size of 507×336 mm at the resin side thereof. Subsequently, with the use of a "Vacuum Press MVLP" manufactured by Kabushiki Kaisha Meiki Seisakusho, both the surfaces were simultaneously subjected to laminating at a degree of vacuum of 1 millibar, a temperature of 80° C., and a pressure of 5 kg by 15-second pressing.

2) After performing thermal curing at 130° C. for 30 minutes, perforating was performed with a carbonic acid gas laser perforator on the market to make a hole with a laser via diameter of 150 μm in the predetermined position(s).

3) The laser via was filled with a copper paste on the market by screen printing. The printing was performed in such manner that one surface was first printed, followed by performing thermal curing at 130° C. for 10 minutes, and then the back surface was similarly printed and thermally cured.

4) After stripping the support base film, the thermal curing was performed at 170° C. for 60 minutes.

5) The resin composition surface was subjected to the roughening treatment with the use of an alkaline oxidizer of permanganate, and 6) a plating resist of the pattern reverse to the pattern of the conductor layer was formed, and a conductor layer circuit was formed only by electroless plating, whereby a four-layer printed wiring board was obtained.

From the results of the Example 1, it is understood that according to the method of the present invention, a clean insulating layer can be easily formed by using an adhesive film. Furthermore, from the results of the Examples 2 and 3, the hole filling screen print required heretofore for each pattern of the via and/or the through hole, and the surface polishing step can be omitted, and it is possible to easily manufacture multilayered printed wiring boards superior in surface smoothness by a buildup process.

Effect of the Invention

According to the method of the present invention, multilayered printed wiring boards can easily be manufactured in good yield and by the buildup process, with the use of an adhesive film.

What is claimed is:

1. A method of manufacturing a multilayered printed wiring board using an adhesive film wherein the adhesive film comprises a support base film on which a mold release layer and a thermosetting resin composition layer are present, wherein the mold release layer is proximal to the support base film and the resin composition layer is laminated on the surface of the mold release layer, and wherein said resin composition layer is the same area as or smaller area than that of the support base film, has thermal fluidity and is solid at normal temperatures, said method comprises:
  a) directly covering a pattern processed portion on one surface or both surfaces of a pattern processed circuit substrate with the resin composition layer of said adhesive film, and heat laminating and pressurizing under a vacuum;
  b) thermally curing the resin composition with the support base film being attached thereto;

c) uncovering the resin composition layer by stripping at least the support base film followed by perforating, or perforating followed by stripping at least the support base film;

d) roughing the resin composition surface; and e) subsequently plating the roughed surface, whereby a conductor layer is formed.

2. The method of claim 1, wherein said perforating is with a laser and/or a drill.

3. The method of claim 1, wherein said thermosetting resin composition is at least one resin selected from the group consisting of an epoxy resin-based material, an acrylic resin-based material, a poylimide resin-based material, a polyamide-imide resin-based material, a polycyanate resin-based material, a polyester resin-based material, and a thermosetting polyphenylene ether resin based material.

4. The method of claim 3, wherein said thermosetting resin composition is an epoxy resin based material.

5. The method of claim 1, wherein said support base film comprises at least one component selected from the group consisting of a polyethylene, a polyvinyl chloride, a polyolefin, a polyethylene terephthalate, a polyester, a polycarbonate, a mold release paper, and a metal foil.

6. The method of claim 1, wherein said support base film has a thickness of 10 to 100 μm.

7. The method of claim 1, wherein said thermosetting resin composition layer has a thickness within the range of the conductive thickness plus 10 to 120 μm.

8. The method of claim 1, wherein said laminating is at a contact bonding temperature of 70 to 130° C., a contact bonding pressure of 1 to 11 kgf/cm$^2$, and a pressure of 10 millibars or less.

9. The method of claim 1, wherein said thermal curing is at a temperature of 100 to 200° C. for 10 to 90 minutes.

10. The method of claim 1, wherein said thermal curing is a step curing process.

11. The method of claim 1, wherein said roughing is selected from the group consisting of chemical treatment, buffing, sand blasting, polishing, and plasma etching.

12. A method of manufacturing a multilayered printed wiring board using an adhesive film wherein the adhesive film comprises a support base film on which a mold release layer and a thermosetting resin composition layer are present, wherein the mold release layer is proximal to the support base film and the resin composition layer is laminated on the surface of the mold release layer, and wherein said resin composition layer is the same area as or smaller area than that of the support base film, has thermal fluidity and is solid at normal temperatures, said method comprises:

a) directly covering a pattern processed portion on one surface or both surfaces of a pattern processed circuit substrate with the resin composition layer of said adhesive film, and heat laminating and pressurizing under a vacuum;

b) thermally curing the resin composition followed by perforating;

c) charging a conductive paste into the resulting holes;

d) uncovering the resin composition layer by stripping at least the support base film followed by thermally curing the conductive paste, or thermally curing the conductive paste followed by stripping at least the support base film;

e) roughing the resin composition surface; and f) subsequently plating the roughed surface, whereby a conductor layer is formed.

13. The method of claim 12, wherein said perforating is with a laser and/or a drill.

14. The method of claim 12, wherein said thermosetting resin composition is at least one resin selected from the group consisting of an epoxy resin-based material, an acrylic resin-based material, a poylimide resin-based material, a polyamide-imide resin-based material, a polycyanate resin-based material, a polyester resin-based material, and a thermosetting polyphenylene ether resin based material.

15. The method of claim 14, wherein said thermosetting resin composition is an epoxy resin based material.

16. The method of claim 12, wherein said support base film comprises at least one component selected from the group consisting of a polyethylene, a polyvinyl chloride, a polyolefin, a polyethylene terephthalate, a polyester, a polycarbonate, a mold release paper, and a metal foil.

17. The method of claim 12, wherein said support base film has a thickness of 10 to 100 μm.

18. The method of claim 12, wherein said thermosetting resin composition layer has a thickness within the range of the conductive thickness plus 10 to 120 μm.

19. The method of claim 12, wherein said laminating is at a contact bonding temperature of 70 to 130° C., a contact bonding pressure of 1 to 11 kgf/cm$^2$, and a pressure of 10 millibars or less.

20. The method of claim 12, wherein said thermal curing is at a temperature of 100 to 200° C. for 10 to 90 minutes, and wherein said thermal curing in d) is at a higher temperature than the thermal curing in b).

21. The method of claim 12, wherein said roughing is selected from the group consisting of chemical treatment, buffing, sand blasting, polishing, and plasma etching.

\* \* \* \* \*